United States Patent
Lasseuguette et al.

(10) Patent No.: US 9,287,834 B2
(45) Date of Patent: Mar. 15, 2016

(54) READ-OUT FOR MEMS CAPACITIVE TRANSDUCERS

(71) Applicant: Cirrus Logic International (UK) Ltd., Edinburgh (GB)

(72) Inventors: Jean Pierre Lasseuguette, Edinburgh (GB); James Deas, Edinburgh (GB)

(73) Assignee: Cirrus Logic International Semiconductor Ltd., Edinburgh (GB)

( * ) Notice: Subject to any disclaimer, the term of this patent is extended or adjusted under 35 U.S.C. 154(b) by 68 days.

(21) Appl. No.: 14/448,848

(22) Filed: Jul. 31, 2014

(65) Prior Publication Data
US 2015/0071466 A1    Mar. 12, 2015

(30) Foreign Application Priority Data
Aug. 2, 2013    (GB) .................................. 1313886.2

(51) Int. Cl.
*H04R 3/00* (2006.01)
*H03F 3/183* (2006.01)
(Continued)

(52) U.S. Cl.
CPC .............. *H03F 3/183* (2013.01); *H03F 1/0266* (2013.01); *H03F 1/3205* (2013.01); *H03F 1/3211* (2013.01); *H03F 3/185* (2013.01); *H03F 3/187* (2013.01); *H03F 3/45071* (2013.01); *H03F 3/45183* (2013.01); *H03F 3/45188* (2013.01); *H03F 3/45197* (2013.01); *H03F 3/45654* (2013.01); *H04R 23/00* (2013.01); *H03F 2003/45008* (2013.01); *H03F 2200/03* (2013.01); *H03F 2200/78* (2013.01); *H03F 2203/45112* (2013.01); *H03F 2203/45244* (2013.01); *H03F 2203/45392* (2013.01); *H03F 2203/45396* (2013.01); *H03F 2203/45418* (2013.01); *H03F 2203/45424* (2013.01);
(Continued)

(58) Field of Classification Search
CPC ................................ H04R 3/00; H04R 23/004
USPC ........................................................... 381/111
See application file for complete search history.

(56) References Cited

U.S. PATENT DOCUMENTS

| 6,509,795 B1 | 1/2003 | Ivanov |
| 7,893,766 B1 | 2/2011 | Cranford, Jr. et al. |

(Continued)

FOREIGN PATENT DOCUMENTS

| JP | 62-76907 A | 4/1987 |
| JP | 2006-332805 A | 12/2006 |
| JP | 2007-251507 A | 9/2007 |

*Primary Examiner* — Simon King
(74) *Attorney, Agent, or Firm* — Jackson Walker L.L.P.

(57) ABSTRACT

Amplifier arrangements for read-out of MEMS capacitive transducers, such as low-noise amplifiers. An amplifier circuit has first and second MOS transistors, with the gate of the first transistor driven by the input signal, and the gate of the second transistor driven by a reference. The sources of the first and second transistors are connected via an impedance. Modulation circuitry is arranged to monitor a signal with a value that varies with the input signal and to modulate the back-bias voltage between the bulk and source terminals of the first and second transistors with the applied modulation being equal for each transistor and based on said monitored signal. The back-bias of the first transistor can be increase to extend the input range of the transistor in situations where the input signal may otherwise result in signal clipping, while avoiding noise and power issues for other input signal levels. By applying an equal modulation to the back-bias of each transistor, there is no substantial modulation of the output signal.

31 Claims, 9 Drawing Sheets

(51) Int. Cl.
*H03F 1/32* (2006.01)
*H03F 3/187* (2006.01)
*H03F 3/45* (2006.01)
*H04R 23/00* (2006.01)
*H03F 1/02* (2006.01)
*H03F 3/185* (2006.01)
*H04R 19/00* (2006.01)
*H04R 19/04* (2006.01)

(52) U.S. Cl.
CPC ............... *H03F2203/45498* (2013.01); *H03F 2203/45658* (2013.01); *H04R 3/00* (2013.01); *H04R 19/005* (2013.01); *H04R 19/04* (2013.01); *H04R 2201/003* (2013.01)

(56) References Cited

U.S. PATENT DOCUMENTS

| | | | | |
|---|---|---|---|---|
| 2007/0160234 | A1* | 7/2007 | Deruginsky | H02M 3/073 381/113 |
| 2009/0003629 | A1* | 1/2009 | Shajaan | H04R 1/005 381/113 |
| 2009/0140778 | A1* | 6/2009 | Kikuchi | H03F 3/45197 327/108 |
| 2010/0315272 | A1* | 12/2010 | Steele | G01D 3/032 241/110 |
| 2013/0287231 | A1* | 10/2013 | Kropfitsch | H02M 3/073 381/113 |

* cited by examiner

READ-OUT FOR MEMS CAPACITIVE TRANSDUCERS

BACKGROUND OF THE INVENTION

1. Field of the Invention

This invention relates to methods and apparatus for read-out of MEMS capacitive transducers, especially MEMS microphones, and in particular to amplifier arrangements, such as low-noise amplifiers, with an improved input range.

2. Description of the Related Art

Micro-electromechanical-system (MEMS) transducers, such as MEMS microphones, are finding application in a range of devices. The MEMS transducer is typically connected to an amplifier to amplify the signal from the transducer. The amplifier is typically a type of low noise amplifier (LNA) which is connected close to the transducer to reduce losses from e.g. parasitic shunt capacitances before amplification.

FIG. 1a illustrates an example of a conventional pre-amplifier circuit for a MEMS capacitive transducer, in this example a MEMS microphone. A first plate of the capacitive transducer 101 is biased by a suitable bias voltage $V_{BIAS}$, say 12V, and the second plate is connected to a reference voltage, typically ground, via a high impedance element $R_{BM}$ 102. The high impedance element 102 may have an impedance of the order of 25 GOhms or so and may, for example, be implemented by one or more polysilicon diodes. In use an acoustic stimulus incident on the transducer will deflect one of the plates of the transducer, thus changing the spacing of the plates and resulting in a change in capacitance. A measurement signal, $V_{in}$, is tapped between the second plate of transducer 101 and high-impedance element 102.

The input signal $V_{in}$ from the transducer is received by an amplifier circuit comprising first and second transistors, 103a and 103b, in this example both being P-channel MOS transistors. The input signal $V_{in}$ drives the gate of the first transistor, PMOS 103a, whilst the gate of the second transistor, PMOS 103b, is connected to ground. The sources of the first and second transistors 103a and 103b are effectively driven by current sources 104a and 104b respectively, and coupled via a resistance $R_s$ 105 to provide a signal dependent current. The drains of the transistors 103a and 103b are each connected to the reference voltage by load resistors 106a and 106b such that the voltages at nodes $D_A$ and $D_B$ provide a differential voltage signal $V_{m1}$ representing the input signal. This differential voltage signal may be converted to a single ended signal $V_{out}$ by amplifier 107 which may also apply some gain $A_V$.

In use the PMOS 103a is typically operated in saturation, i.e. with a relatively high magnitude drain-source voltage $V_{ds}$. As will be appreciated the saturation region for a PMOS occurs (assuming $V_{gs} < V_{TP}$) when $V_{ds} \leq V_{gs} - V_{TP}$, where $V_{TP}$ is the (negative) threshold voltage. Thus saturation occurs when $V_{dg} \leq -V_{TP}$. In other words the PMOS 103a will drop out of saturation if the drain voltage is more positive than the gate voltage by the magnitude of $|V_{TP}|$. If the spacing of the plates of the capacitive transducer is changed by an incident stimulus such that the input signal $V_{in}$ goes more negative than the drain voltage of PMOS 103a by an amount greater than $|V_{TP}|$ the PMOS 103a will drop out of saturation. This effect is exacerbated by the fact that as $V_{in}$ goes more negative the voltage at node $D_A$ goes more positive as illustrated in FIG. 1b.

FIG. 1b illustrates how the voltages at nodes $D_A$ and $D_B$ vary with where the gate voltage of PMOS 103a is equal to $V_{in}$. It will be seen that if $V_{in}$ is equal to ground then the voltage at node $D_A$ will have a certain positive value, equal in magnitude to the quiescent gate-source voltage $V_{gs0}$ of transistor $M_{PA}$ 103a required to support the quiescent drain current. In this example the current source 104a and load resistance 106a associated with PMOS 103a are matched to equivalent elements 104b, 106b of identical PMOS transistor 103b so at $V_{in} = 0$ by symmetry the voltage at node $D_A$ matches the voltage at node $D_B$. As $V_{in}$ goes negative however more current flows through transistor 103a resulting in the voltage at node $D_A$ increasing until a point $V_{inX}$ is reached where the gate-drain voltage of transistor 103a equals the threshold. At this point the transistor will drop out of saturation into the linear or triode region of operation. The PMOS 103a will then struggle to pass sufficient current and the amplifier signal will become non-linear and eventually clip to some value.

The amplifier may only begin to clip for relatively large input signals, for instance an input sound level of 94 dBSPL may lead to a voltage swing of about 7 mV rms which may be within the range of saturation for the circuit shown in FIG. 1a. For at least some applications this may be sufficient and it may not matter that larger signal levels clip. However there are increasing demands to be able to handle higher signal levels. One way to address this problem and extend the negative input range is stabilise the voltage at node $D_A$ to a nominal bias voltage as illustrated in FIG. 2a. FIG. 2a shows a similar circuit to that illustrated in FIG. 1a where similar components are designated by the same reference numerals. In the circuit shown in FIG. 2a however the voltage at node $D_A$ is stabilised to a nominal bias voltage $V_{BD}$ applied to one input of differential amplifier 201a. The other input terminal of this differential amplifier is connected to node $D_A$ and the amplifier steers more or less current through the PMOS 103a and into the load resistor $R_{LA}$ 106a to stabilise the voltage across the resistor to equal $V_{BD}$. This means that the current through PMOS 103a is stabilised to equal $V_{BD}/R_{LA}$ and no longer changes with signal which can help to linearise this input stage. The source voltage for PMOS 103a, i.e. the voltage of node $S_A$, follows $V_{in}$ closely with a constant $V_{gs}$ shift. Likewise differential amplifier 201b stabilises the voltage at node $D_B$ and thus the source voltage at node $S_B$ for PMOS 103b is forced to be a constant voltage ($V_{gs}$) above its gate voltage at ground. Thus a current equal to $(V(S_A) - V(S_B))/R_S = V_{in}/R_S$ flows through resistor 105. This current modulation also flows through resistors 202a and 202b to provide an amplified differential voltage signal $V_{m1}$ across their lower terminals.

As illustrated in FIG. 2b, the PMOS 103a will now go out of saturation at the value $V_{inY}$ at which Vin is lower than the fixed voltage $V_{DA}$ by $|V_{TP}|$ rather than the smaller voltage $V_{inX}$ of FIG. 1b. Thus the negative input range of the amplifier circuit of FIG. 2a can be increased over that of the amplifier of FIG. 1a when biased similarly. For example with a typical bias voltage of around 200 mV, and a typical threshold voltage $V_{TP}$ of −600 mV, this means the input signal $V_{in}$ may go as low as −400 mV before the onset of clipping. An input range of this order would typically allow an input signal of the order of about 123 dBSPL before clipping. In some applications however there is a desire to allow even larger input signal levels without clipping. For instance to cope with a 129 dBSPL input signal would the amplifier circuit to be able to operate correctly with an input signal having a negative peak magnitude of the order of about 800 mV.

SUMMARY OF THE INVENTION

Embodiments of the present invention thus relate to amplifier circuits for MEMS capacitive transducers that at least partly mitigate at least some of the disadvantages mentioned above.

Thus according to the present invention there is provided an amplifier circuit for amplifying an input signal from a MEMS capacitive transducer, the circuit comprising:

first and second MOS transistors each having source, gate, drain and bulk terminals, wherein the gate terminal of the first transistor is configured to receive the input signal and the source terminal of the first transistor is electrically coupled to the source terminal of the second transistor via an impedance and the gate terminal of the second transistor is configured to receive a reference voltage; and modulation circuitry configured to:

receive a monitored signal which has a value that varies with the value of the input signal relative to said reference voltage; and controllably modulate a back-bias voltage between the bulk terminal and the source terminal of the first transistor and also a back-bias voltage between the bulk terminal and the source terminal of the second transistor, wherein the modulation applied to vary the back-bias voltage of each transistor is equal and based on said monitored signal.

The modulation circuitry may be configured to modulate the back-bias voltages of the first and second transistors so that the back-bias voltages are greater for a first range of values of the monitored signal relative to a second range of values of the monitored signal. For the second range of values a zero value modulation may be applied to the back-bias voltages. For the second range of values the back-bias voltage of each of the transistors may be substantially zero such that the respective bulk terminal of the transistor is substantially the same voltage as the respective source terminal of the transistor.

The modulation circuitry may be configured to: maintain the voltage of the bulk terminal of each of the transistors so as to maintain the back-bias voltages of the transistors at base values if the monitored signal does not exceed a first boundary; and modulate the voltage of the bulk terminal of said each of said transistors so as to increase the back-bias voltages if the monitored signal exceeds the first boundary. The first boundary may be set so as to correspond to the edge of a saturation operating mode of the first transistor in use or within a range of 50-150 mV of the edge of a saturation operating mode with the first transistor having a back-bias voltage at the base value. The first boundary may be set such that, when the monitored signal is at the first boundary the value of the input signal is within a range of about −400 mv to −250 mV.

The base values of back-bias for the first and second transistors may be substantially the same as one another and/or the base value of back-bias for the first transistor may be substantially zero.

The modulation circuitry may be configured such that, when the monitored signal exceeds the first boundary, the magnitude of the back-bias voltage modulation applied increases with magnitude of the monitored signal. The magnitude of the back-bias voltage modulation applied may increase with magnitude of the monitored signal until a maximum voltage modulation is reached. The magnitude of the back-bias voltage modulation applied may increase stepwise or substantially continuously with the magnitude of the monitored signal. For at least some values of the monitored signal the back-bias voltage modulation may increased so as to allow an input signal peak value of at least −800 mV to be amplified without substantial clipping.

The modulation circuitry may comprise control circuitry for determining the amount of any voltage modulation to be applied and adjustment circuitry, responsive to the control circuitry, to apply any modulation. In one embodiment the bulk terminal and source terminals of each transistor are connected via a respective resistance and the adjustment circuitry comprises first and second current sources for generating respective modulation currents at the bulk terminals of the first and second transistors in response to the control circuitry. The first and second current sources may be current mirrors configured to replicate a control current generated by said control circuitry. The circuit may further comprise first and second current sinks respectively connected to the source terminals of the first and second transistors for sinking a current substantially equal to the respective modulation current. The control circuitry may comprise a control differential amplifier for receiving the monitored signal and generating a control current based on the monitored signal. The control differential amplifier may have an input voltage offset such that the control current is zero unless the monitored signal exceeds the input voltage offset. The control differential amplifier may comprise first and second control circuit transistors which have different channel characteristics to provide at least part of said input voltage offset and/or are configured to have different source voltages and/or currents in use so as to provide at least part of said input voltage offset. The control differential amplifier may generate an intermediate current and the control circuit may further comprise at least one current source or current sink for generating a threshold current configured such that the control current corresponds to any component of the intermediate current greater than the threshold current.

The amplifier circuit may be arranged with the first and second transistors configured as part of a differential amplifier to generate a differential signal corresponding to the input signal. The differential signal may be used as said monitored signal. In such embodiments there may be common-mode control circuitry for controlling the common-mode voltage of said differential signal. The common-mode control circuitry may comprise comparison circuitry for comparing a drain voltage of each of the first transistor and second transistor with a reference bias voltage and adjusting source currents supplied to the source terminals of each of the first transistor and second transistor.

The first and second transistors may be P-channel MOS transistors and increasing the back-bias voltage of said transistors may comprise modulating the voltage of the bulk terminal to be more positive than the voltage of the source terminal.

The amplifier circuit may be formed as an integrated circuit. In use a MEMS capacitive transducer is connected to the circuit and in some embodiments may be formed as part of the integrated circuit. The MEMS capacitive transducer may be a MEMS microphone.

The amplifier circuit may form part of an electronic device which may be at least one of: a portable device, a battery powered device, a computing device, a communications device; a gaming device; a mobile telephone; a laptop computer; and a tablet computer.

In another aspect of the invention there is provided a method of amplifying an input signal produced by a MEMS capacitive transducer, the method comprising:

applying the input signal to a gate terminal of a first MOS transistor;

applying a reference voltage to a gate terminal of a second MOS transistor;

wherein the a source terminal of the first transistor is electrically coupled to a source terminal of the second transistor via an impedance;

receiving a monitored signal which has a value that varies with the value of the input signal relative to said reference voltage; and controllably modulating a back-bias voltage between a bulk terminal and the source terminal of the first transistor and also a back-bias voltage between a bulk terminal and the source terminal of the second transistor, wherein the modulation applied to vary the back-bias voltage of each transistor is equal and based on said monitored signal.

The method of this aspect of the invention may be implemented in all of the variants described above.

In another aspect there is provided an amplifier circuit for amplifying an input signal from a MEMS capacitive transducer, the circuit comprising: first and second MOS transistors configured such that the gate terminal of the first transistors is driven by the input signal and source terminals of the first and second transistors are electrically coupled via an impedance wherein the back-bias between a bulk terminal and a source terminal of the each said transistor varies equally in accordance with the value of the input signal.

In a further aspect there is provided an amplifier circuit for amplifying an input signal from a MEMS capacitive transducer, the circuit comprising: first and second MOS transistors configured such that the respective gate terminals of the first and second transistors are respectively driven by the input signal and a reference voltage and the respective source terminals of the first and second transistors are electrically coupled via an impedance; wherein the back-bias between a bulk terminal and a source terminal of each said transistor is varied equally by modulation circuitry in accordance with the value of the input signal.

A further aspect provides an amplifier circuit for amplifying an input signal from a MEMS capacitive transducer, the circuit comprising: first and second MOS transistors configured such that the respective gate terminals of the first and second transistors are respectively driven by the input signal and a reference voltage and the respective source terminals of the first and second transistors are electrically coupled via an impedance; and modulation circuitry configured to equally vary the back-bias between a bulk terminal and a source terminal of each said transistor in response to a monitored signal dependent on the value of the input signal.

Embodiments of the invention provide an amplifier circuit for amplifying an input signal from a MEMS capacitive transducer, the circuit comprising: first and second MOS transistors with respective source terminals electrically connected via a resistance and with respective gate terminals connected respectively to the input signal and a reference voltage; and modulation circuitry configured to equally modulate the back-bias of each said transistor in response to a monitored signal dependent on the value of said input signal relative to said reference voltage.

BRIEF DESCRIPTION OF THE DRAWINGS

The invention will now be described by way of example only, with respect to the accompanying drawings, of which.

DETAILED DESCRIPTION OF THE PREFERRED EMBODIMENTS

Figure 3:
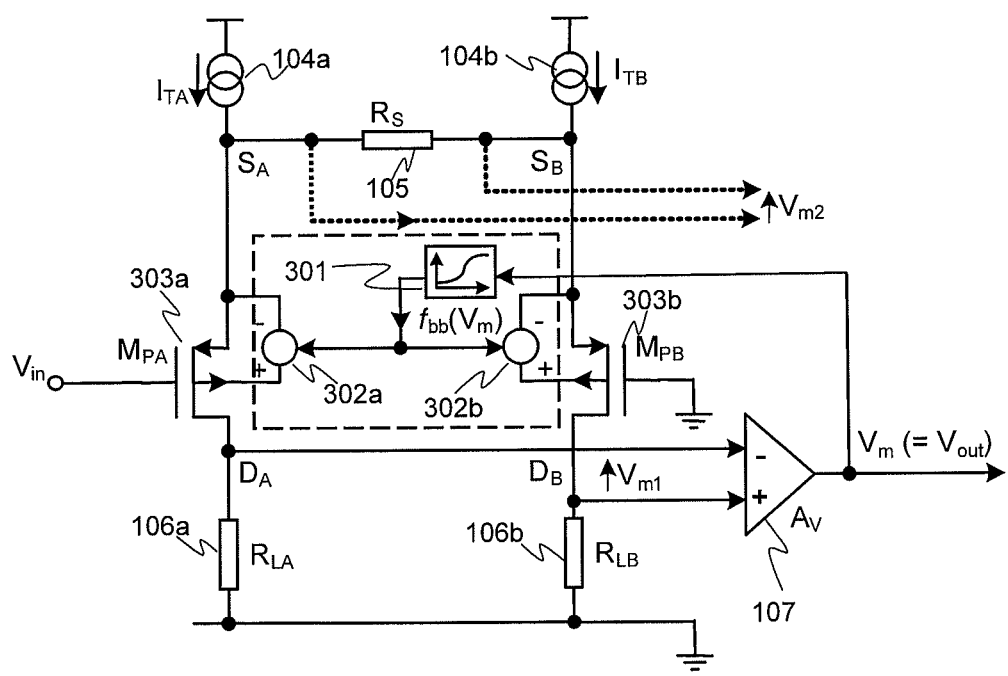
FIG. 3 illustrates an amplifier circuit according to an embodiment of the invention.

FIG. 3 illustrates an amplifier circuit according to an embodiment of the invention, e.g. a low-noise amplifier, for receiving an input signal, $V_{in}$, from a MEMS capacitive transducer and producing an amplified output signal $V_{out}$. The circuit shown in FIG. 3 is similar to that discussed above in relation to FIG. 1a and similar components are identified using the same reference numerals. Again first and second MOS transistors 303a and 303b are arranged to provide a differential output signal $V_{m1}$ with the gate terminal of the first transistor 303a being connected to an input for receiving the input signal $V_{in}$ from the MEMS capacitive transducer. The gate of the second transistor 303b may be connected to a reference, which may be a fixed voltage, e.g. ground in this example, but could be a noisy return for a pseudo-differential arrangement. Thus the signal anticipated in use will be a relatively large single-ended input signal, combined with a relatively small or essentially zero signal component common to both inputs, in contrast to say an op amp input stage which will see a very small differential input voltage in normal use but may see a substantial common-mode voltage In the circuit of FIG. 3 a back-bias voltage between the bulk and source terminals of each of the first transistor, PMOS 303a, and second transistor, PMOS 303b, is controlled with a dependence on the value of the input signal by monitoring a signal of the circuit (a monitored signal) which varies in accordance with the input signal, i.e. the value of the input signal relative to the reference. In the example of FIG. 3 the signal is monitored at the output of the amplifier circuit.

The modulation applied to modulate the back-bias voltage of transistor 303a, i.e. the variation in voltage between the bulk terminal and source terminal, is substantially equal to the modulation applied to the back-bias voltage of transistor 303b. As will be described later this modulation therefore does not result in a modulation of the output signal. However, as will be explained this modulation can improve the input range of the amplifier circuit. It will of course be appreciated that the source terminals of the first and second transistors 303a, 303b are electrically connected via an impedance $R_s$ 105 and thus may be at different voltages in use. It is the modulation applied to the back-bias voltage, i.e. the variation in the voltage difference between the bulk and source terminals of the first and second transistors 303a, 303b, which is signal dependent and equal.

Figure 1A:
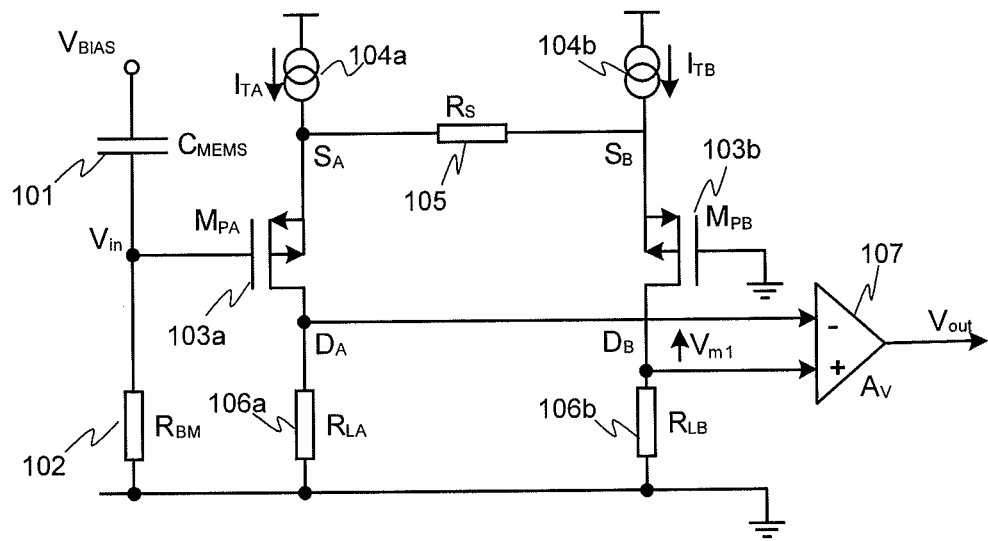
FIGS. 1a and 1b illustrate a convention amplifier circuit and how the voltages of this circuit change with input signal voltage.
Figure 1B:
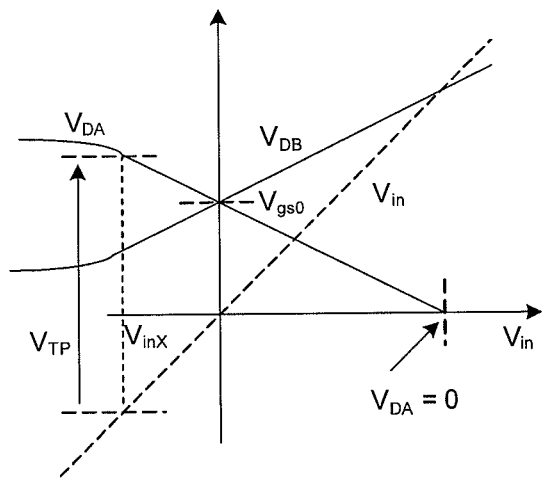

In the circuit illustrated in FIG. 1a the transistors 103a and 103b are connected in a conventional arrangement with the bulk terminal being connected to the source terminal so that the transistor is, in effect, operated as a three terminal device.

This means that the bulk and source terminals are always at the same voltage as each other, irrespective of the input signal. By contrast, in the circuit illustrated in FIG. 3 the transistors 303a and 303b are connected in an arrangement with the bulk terminal not being directly connected to the source terminal so that the transistor is, in effect, operated as a four terminal device. Therefore, in embodiments of the present invention, a deliberate non-zero back-bias voltage may be introduced between the bulk and source terminals, for at least some values of the input signal level. As will be appreciated by one skilled in the art introducing a back-bias voltage between the bulk and source terminals of a MOS transistor can increase the magnitude of the threshold voltage for that transistor. For a PMOS, increasing the back-bias, i.e. making the bulk voltage more positive than source voltage, can increase the magnitude of its threshold voltage $V_{TP}$. In embodiments of the present invention the bulk-source voltage is therefore controlled based on the value of the input signal $V_{in}$ so that the magnitude of the threshold voltage $V_{TP}$ can be increased, to avoid dropping out of saturation. For the example shown in FIG. 3 the back-bias is increased (i.e. the bulk voltage becomes more positive than source voltage) when the input signal level is increasingly negative.

The circuit of FIG. 3 therefore includes modulation circuitry, which in this particular example comprises control circuitry 301 and adjustment circuitry 302a. The control circuitry 301 is arranged to monitor a signal, $V_m$, which has a value which depends on the value of the input signal $V_{in}$. In this example the output signal $V_{out}$ is used as the monitored signal $V_m$. It will be appreciated that the value of the output signal $V_{out}$ will follow that of the input signal—with a gain arising from the values of load resistors 106a and 106b and resistor 105 and also any gain $A_V$ applied by element 107. However as will be explained later the monitored signal $V_m$ could be derived from other parts of the amplifier circuit, although preferably the monitored signal is a buffered or amplified version of the input signal, and the monitored signal could be a differential signal. For at least a range of values of the monitored signal (corresponding to relatively high magnitude negative values of the input signal) the control circuit 301 may apply a desired function, $f_{bb}(V_m)$ to determine a desired voltage modulation, and via adjustment circuitry 302a apply the voltage modulation between the bulk and source terminals of the first transistor 303a. The voltage modulation will make the bulk voltage more positive than the source voltage, for at least this range of values of the monitored signal. In other words for at least a first range of values of the monitored signal $V_m$ the back-bias of each of the first and second transistors may be modulated so that the back-bias is greater for a first range of values of the monitor signal relative to a second range of values of the monitored signal.

The voltage modulation may be implemented in a number of different ways. For example, a modulation voltage may be added to the voltage at the bulk terminal relative to the signal dependent voltage at the source terminal.

As shown in FIG. 3 the bulk voltage of the second transistor 303b is also modulated in the same way relative to its source voltage. Thus the modulation circuitry may also include adjustment circuitry 302b which receives the same modulation control signal from control circuitry 301 so as to provide an equivalent modulation to the bulk-source voltage of second transistor 303b. Thus in this example the bulk-source voltages of each of the first and second transistors 303a and 303b are maintained equal to one other despite any separate signal dependence of their source voltages. Modulating the back bias of the first and second transistors 303a and 303b equally will give equal modulation of the respective threshold voltages. This may be regarded as equivalent to applying equal voltage sources of value equal to the change in threshold voltage in series with the gate terminals of both $M_{PA}$ and $M_{PB}$. This does not disturb the equivalent applied input difference signal, thus the amplifier output signal $V_{out}$ is not affected by the back-bias modulation applied.

In some embodiments, it may be desirable not to modulate the back bias for small or normal signals, e.g. for signals that would not lead to clipping. MEMS microphone transducers for example typically have a capacitance of only 1 pf or so and the input transistor MPA 103a is typically sized to have a similar gate capacitance to optimise noise performance. Any modulation of back-bias or the resulting change in gate-source voltage may couple back to the transducer, via inevitable parasitic gate-source overlap capacitance for example, to give a spurious equivalent input signal component. Also any thermal noise in the circuit elements used to implement separate sources 302a and 302 may also generate noise in $V_{out}$. Noise on the power supply may also couple into the signal path via the back bias modulation circuitry. As illustrated by embodiments described later, this noise may well increase as the amount of back-bias is increased. Also the power supply current needed to generate the back bias may increase as the amount of back bias increases, compared to that quiescent current needed when the back bias is zero.

Thus to avoid increased power consumption and any impact on performance any modulation of the back-bias may be kept substantially at zero, until the monitored signal indicates that the transistor is near the edge of saturation, i.e. the monitored signal $V_m$ indicates that the input signal $V_{in}$ is near a value that would lead to a drop out of saturation and a start of clipping. Any extra noise or other spurious signals introduced may be much less noticeable in the presence of large signals and in any case preferable to gross artefacts introduced by clipping. Applying a zero-value modulation to the back-bias means that the back-bias of each of the first and second transistors will have some base value. Typically this base value will be zero, i.e. the bulk voltage may be maintained at substantially the same voltage as the source terminal. However as will be explained later there may be some instances where a (typically small) non-zero base value of back-bias is desired, for instance for control of d.c. offset. In such instances the first and second transistors 303a and 303b may have different values of base back-bias but the signal dependent modulation to back-bias applied to each transistor will be the same.

In other words, based on the expected relationship between the input signal $V_{in}$ and the monitored signal $V_m$ there may be a second range of values of the monitored signal for which no back-bias modulation is applied. For example a first boundary may be set for the monitored signal, taking into account the relevant gain from input signal $V_{in}$ to monitored signal $V_m$ of the amplifier circuit, in this example including the gain of the first stage to $D_A$ and $D_B$ and the gain $A_V$ of amplifier stage 107, where on one side of the boundary the first transistor will be operating in saturation. For a monitored signal which is the same polarity as the input signal the first boundary may therefore be a negative boundary, i.e. have a negative value, and values of the monitored signal above the boundary, e.g. more positive, correspond to the first transistor being in saturation mode. If the monitored signal is above the first boundary, i.e. the negative boundary is not exceeded, the control circuit 301 therefore applies no bias modulation between the bulk and source voltages of the first and second transistors. If however the monitored signal drops below the first boundary, i.e. exceeds the negative boundary, a modulation may be applied to increase the back-bias. The first boundary may be set at a level at or near a value that corresponds to the expected edge of saturation (for no back-bias) so that were the monitored signal to exceed the first boundary, with no back-bias modulation applied, the first transistor would most likely have dropped out of saturation mode or be near dropping out of saturation. For example the first boundary may be set such that when the monitored signal is at the first boundary, the value of the input signal is within a range of about 50-150 mV inclusive of the edge of a saturation operating mode (when the first transistor has a back-bias voltage at the base value). This may, for instance, correspond to a value of the input signal is within a range of about −400 mv to −250 mV.

There are a number of ways in which the modulation could be applied. A single step change modulation could be applied or a series of step changes could be applied based on a series of boundaries. Additionally or alternatively for at least a range of values of the monitored signal the back-bias modulation could be varied based on the value of the monitored signal in a substantially continuous manner.

For example in the circuit of FIG. 3 the control circuit may apply no bias modulation if the value of the monitored signal $V_m$ is above a first boundary. For values of the monitored signal below the first boundary a scaled version of the monitored signal value may be provided as a modulation signal, possibly with an offset so that the modulation signal value is equal to zero at the first boundary. Thus the modulation signal may have a value based on $k \cdot (V_m - a)$, where "k" is a scaling factor and "a" is an offset equal to the value of $V_m$ at the first boundary. The scaling factor k may therefore be chosen to give a desired bias modulation for the value of $V_m$.

In some embodiments the back-bias modulation may be increased until the modulation is limited by circuit effects, for instance until the applied bulk voltage applied to at least transistor MPB 305b reaches supply. However any noise on the supply will then couple directly to the bulk voltage, rather than being attenuated by the power supply rejection of the modulation circuitry, and may then inject substantial supply-related noise into the amplifier output signal. Also for an increasingly negative signal applied to the input of PMOS $M_{PA}$ 303a, the bulk voltage applied to PMOS $M_{PB}$ 303b will clip at the supply voltage well before the bulk voltage applied to PMOS $M_{PA}$ 303a, giving a large spurious signal due to the continuing increases in PMOS $M_{PA}$ 303a threshold voltage. Thus it may be preferable to only increase the back-bias modulation until an upper limit is reached, i.e. once the monitored signal reaches a second boundary no further modulation of the back-bias may be implemented.

The amount of back-bias modulation is controlled to ensure that the first transistor 303a remains substantially in saturation for larger magnitude negative input signals. For instance the back-bias could be controlled to allow a peak negative input signal of the order of −800 mV which would allow an input acoustic signal of the order of 129 dBSPL to be received without signal clipping.

A variation in bulk-source voltage $V_{bs}$ can lead to a variation in threshold voltage, in use, according to:

$$-V_T = -V_{T0} + \gamma \cdot (\sqrt{(V_{bs}+\phi)} - \sqrt{\phi}) \qquad \text{eqn. (1)}$$

where $V_{T0}$ is the threshold voltage when no back bias voltage is applied, γ is a process dependent parameter (relating to doping and oxide thickness) and φ is another process dependent parameter (relating to doping) typically about 0.7V.

Thus for a desired change in threshold voltage, $\Delta V_T$ a desired back-bias may be calculated by rearranging equation (1) and the modulation circuitry designed to provide this back bias.

In the circuit of FIG. 3 the output voltage $V_{out}$ is used as the monitored signal $V_m$. The monitored signal could however be derived from other parts of the amplifier circuit. For instance the differential voltage $V_{m1}$ between nodes $D_A$ and $D_B$ could be used as the monitored signal (and this differential voltage $V_{m1}$ could be measured to be of opposite polarity to the input signal, and the output signal, so that the back-bias modulation is applied when the monitored signal is above, i.e. exceeds, a positive boundary). The difference voltage $V_{m2}$ between the sources node $S_A$ and $S_B$ could also be used as the monitored signal. It will be appreciated that the source voltage $S_A$ and $S_B$ may be modulated by the modulation circuitry in use but the same voltage modulation is applied to each node and thus there is no effect on the difference voltage signal. In other variants amplifier 107 may produce a differential output (for example for driving a differential-input on-chip ADC) which may or may not be used as the monitored signal.

In theory the input signal itself could be used as the monitored signal, for instance by looking at the difference voltage between the gates of the first and second transistors 303a, 303b but in practice this would put result in extra devices and or parasitic capacitances on the input node, and for capacitive transducers in particular the input capacitance has to be minimised to avoid attenuating the input signal. So preferably the signal used as the monitored signal is taken from a later node or nodes of the amplifier, i.e. after some buffering or amplification.

It will of course be appreciated that the gain of the monitored signal with respect to the input signal may be different depending on where the signal is monitored, e.g. in FIG. 3 the monitored signal $V_m$ may have a gain of $A_v$ with respect to the differential voltage signal $V_{m1}$ which itself will have a gain influenced by $R_S$, $R_{LA}$ and $R_{LB}$. The gain relevant for the monitored signal should be taken into account in setting any boundary values and the amount of back-bias modulation required for a given monitored signal value.

The embodiment of FIG. 3 includes amplifier stage 107 which also acts as a differential-to-single-ended converter, providing a single-ended signal as the amplifier output signal Vout and as a monitor signal supplied to element 301. In other embodiments one or both of these signals may be derived as differential signals, and/or may be currents rather than voltages.

Figure 2A:
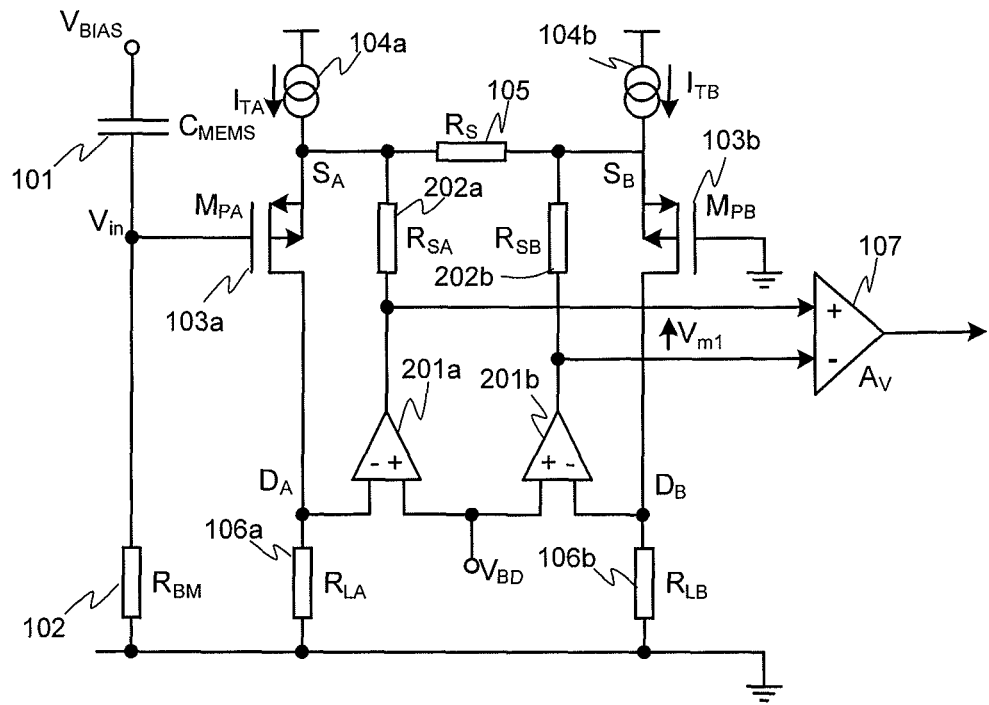
FIGS. 2a and 2b illustrate another known amplifier circuit and how the voltages of this circuit change with input signal voltage.
Figure 2B:
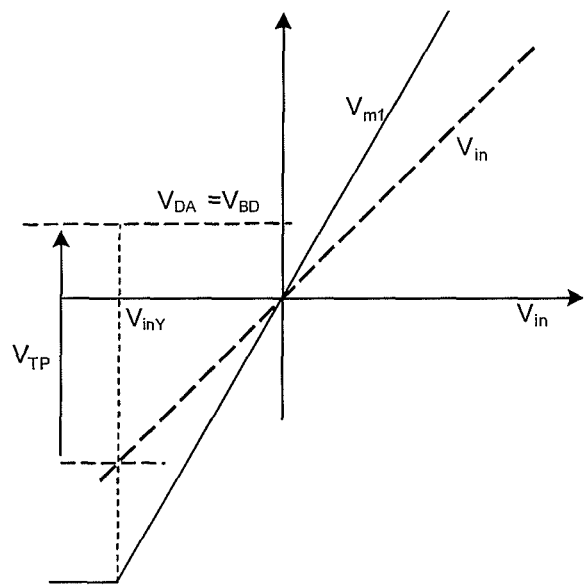
Figure 4:
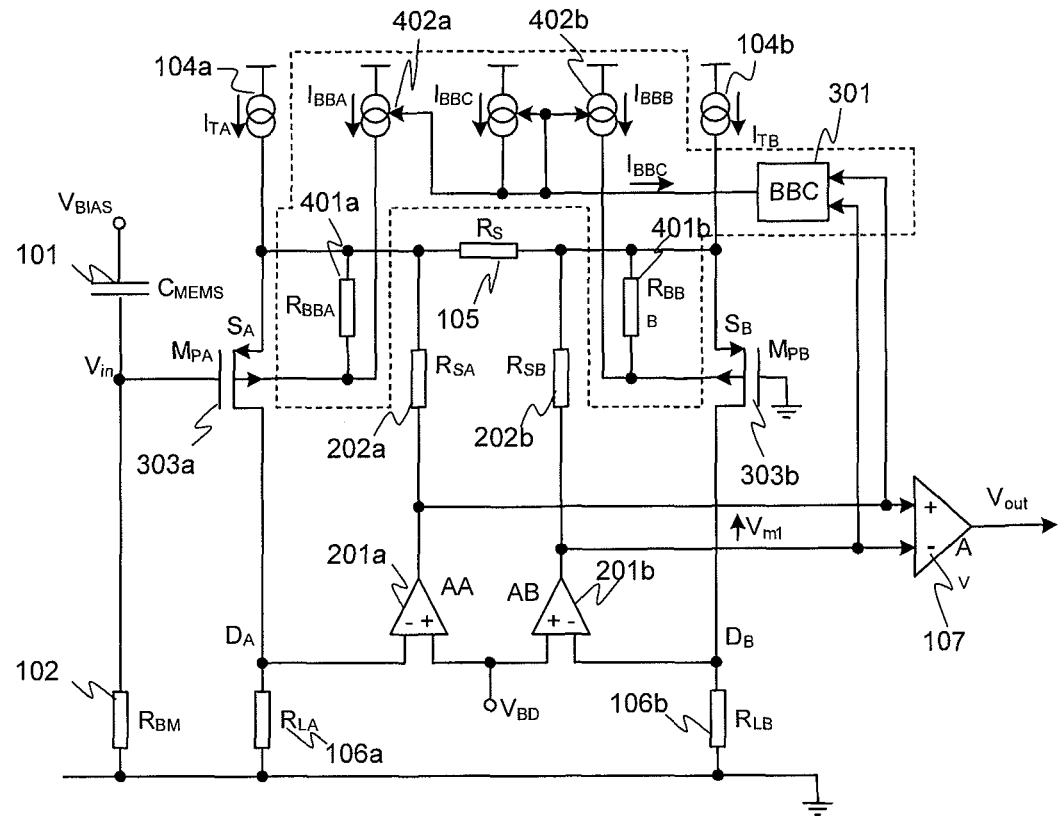
FIG. 4 illustrates an amplifier circuit according to another embodiment of the invention.

FIG. 4 illustrates an alternative embodiment of the invention. The amplifier circuit shown in FIG. 4 is similar to that shown in FIG. 2a with differential amplifiers 201a and 201b arranged to stabilise the drain voltages of the first and second transistors 303a and 303b and with the output signal being based on the differential signal $V_{m1}$ due to signal dependent currents flowing through resistors 105, 202a and 202b.

In the embodiment of FIG. 4 this differential signal $V_{m1}$ is used as the monitored signal by back-bias control circuitry 301. In this embodiment the bulk terminals of transistors 303a and 303b are connected to the respective source terminals via resistors 401a and 401b respectively. The bulk terminals are also connected to current sources 402a and 402b respectively. The resistors 401a and 401b and current sources 402a and 402b comprise adjustment circuitry. In use, if the monitored signal $V_{m1}$ indicates a large magnitude negative input signal is being received the control circuitry 301 controls modulation currents generated by current sources 402a and 402b. There are many ways in which the currents of current sources 402a and 402b could be controlled but in this example the control circuitry 301 generates a current $I_{BBC}$ which is replicated by current sources 402a and 402b. These currents are applied across respective resistors 401a, 401b so as to increase the respective potentials of the bulk terminals of first and second transistors 303a and 303b. In this example the modulation current $I_{BBA}$ generated by current source 402a matches the modulation current $I_{BBB}$ generated by current source 402b and the resistors 401a and 401b are also matched so that the modulation of the back-bias is the same for both the first and second transistors 303a and 303b. This means that the signal voltage across resistor 105 and hence the differential voltage $V_{m1}$ remains unchanged despite the separate modulation of the back-bias of the two wells.

Figure 5:
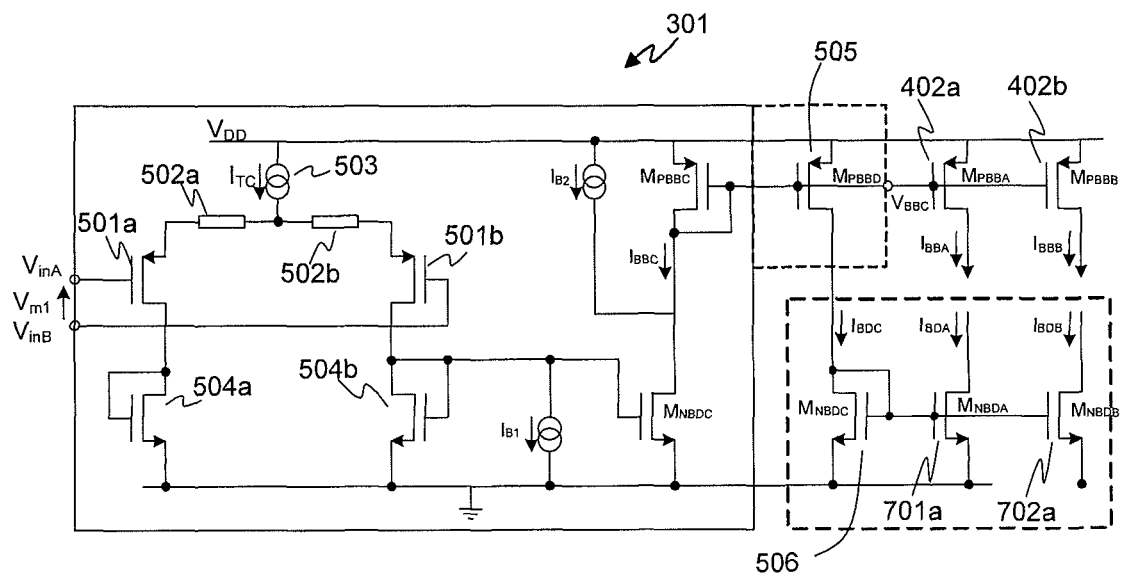
FIG. 5 illustrates one embodiment of suitable modulation control circuitry.

FIG. 5 shows one embodiment of back-bias control circuitry 301 and how it may control the adjustment circuitry 402a and 402b. The differential input signal $V_{m1}$ is received at inputs $V_{inA}$ and $V_{inB}$; which are connected to the gates of PMOS 501a and PMOS 501b respectively. The sources of these PMOS transistors are connected via resistors 502a and 502b respectively to a current source 503, while the drains of transistors 502a and 502b are connected to ground via NMOS 504a and 504b respectively, each NMOS being connected as a diode.

The transistors 501a and 502b, in conjunction with resistors 502a and 502b generate a current $I_{BBC}$ which is mirrored, possibly with a desired gain, by current mirrors, acting as current sources 402a and 402b to provide the modulation currents $I_{BBA}$ and $I_{BBB}$ supplied to the bulk nodes of first and second transistors 303a and 303b.

Figure 6A:
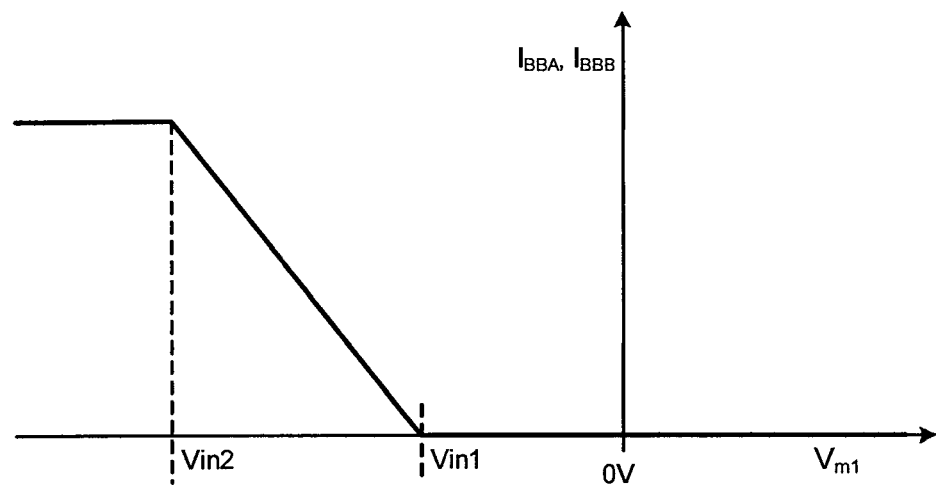
FIGS. 6a and 6b illustrate one example of a transfer characteristic of the modulation control circuitry.

As mentioned above it may be desired to apply no back-bias modulation until a first boundary is reached. Thus the modulation currents $I_{BBA}$ and $I_{BBB}$ may be zero until a first boundary $V_{in1}$ is reached, which may correspond to substantially the voltage at which the first transistors 303a would come out of saturation if no back-bias modulation was applied, e.g. corresponding to an input signal level of about −400 mV. The modulation currents may then may steadily increase with increasing negative values of the monitored voltage until a second boundary $V_{in2}$ is reached. This maximum value of modulation current is designed to be sufficient so that, when applied across resistors 401a and 402b the bulk voltage is increased with respect to the source voltage by an amount sufficient to increase the threshold voltage by a desired amount. It will be appreciated that in this embodiment the currents $I_{BBA}$ and $I_{BBB}$ which generate the bias modulation are increasingly positive with higher negative values of the input signal. FIG. 6a illustrates the transfer characteristic between $V_{m1}$ (which has an expected relationship to the input signal $V_{in}$) and the modulation currents.

There are various ways in which the control circuitry of FIG. 5 could be configured to generate such a transfer characteristic. The values of resistors 502a and 502b could be unequal to give an input voltage offset due to the unequal split of the current $I_{TC}$ between the two resistors. Additionally or alternatively the PMOS 501a may be designed to provide drain current versus gate-source voltage (Ids–Vgs) characteristics different to PMOS 501b, e.g. by having different gate width (W) and/or gate length (L), or different gate dielectric thickness or local substrate doping to provide an offset via the different (Ids–Vgs) characteristics. The value of the offset defines the value of the first boundary.

As a further alternative, or additional technique, sink current $I_{B1}$ and/or source current $I_{B2}$ may be provided as one or more boundary currents so that the input stage of the control circuitry 301 has a boundary that must be overcome before net current can be supplied to the current mirrors. In effect the input stage differential amplifier generates an intermediate current and only any component of the intermediate current greater than the (combined) boundary current is passed to the current mirrors as a control current.

Using different values of resistors 502a and 502b and/or different channel characteristics of the transistors 501a and 501b so that the offset is applied in the input stage has the advantage that for most values of $V_{m1}$ there is no current in the output stage of the control circuitry, which saves on quiescent current. However even in such an arrangement it may be beneficial to provide current sink $I_{B1}$ and/or source $I_{B2}$ as low current pull-offs to avoid second order effects, such as pick-up of spurious signals or very slow response when NMOS current 504b is near but not quite zero.

In some embodiments there may be sufficient headroom with zero input signal for the first transistor MPA 303a (and by symmetry for transistor MPB 303b) to allow for no need for back bias modulation up to an input negative signal magnitude of perhaps 400 mV. However in some embodiments the first and second transistors MPA and MPB may be near the edge of saturation even for zero input signal, in which case the back-bias modulation may need to start immediately the input signal goes negative. In other words the constant "a" referred to above may be designed to be zero or close to zero.

Figure 6B:
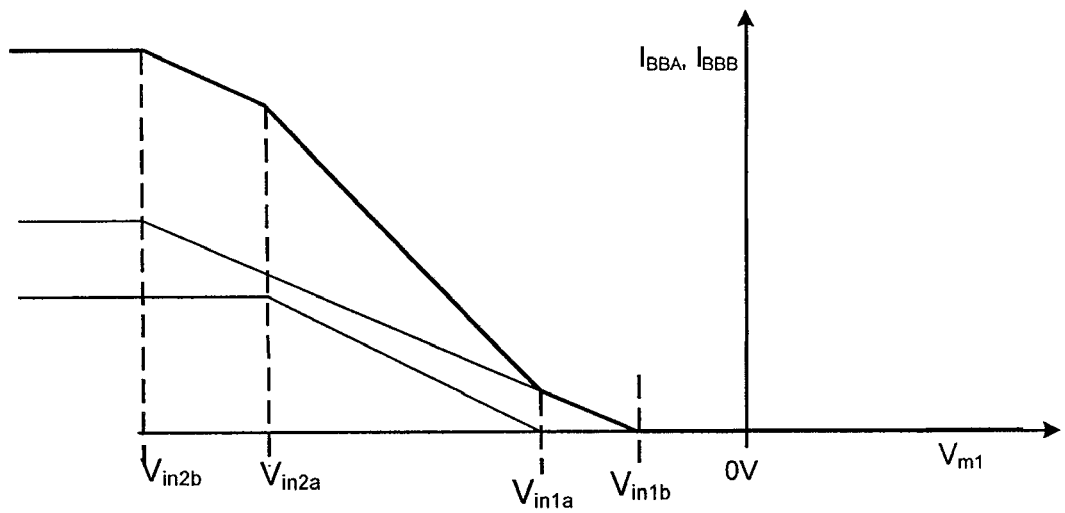

FIG. 6a shows a modulation control transfer characteristic with abrupt changes in slope at $V_{in1}$ and $V_{in2}$. This may give issues with dynamic circuit behaviour, for example the response to a fast triangle wave may show some discontinuity as the back bias suddenly starts ramping and injecting displacement current into signal path. Practical circuits may naturally round the corners of such a characteristic somewhat. Also the characteristics may be modified, for example to provide characteristics as illustrated in FIG. 6b, by duplicating elements 501a, 501b, 502a, 502b, 503 of FIG. 5 and connecting the drains of the additional transistors in parallel to diodes 504a 504b. Each set of elements would be designed to contribute a different component of slope starting at a respective $V_{in1}$ (say $V_{in1a}$, $V_{in1b}$) and possibly terminating at a different $V_{in2}$ (say $V_{in2a}$, $V_{in2b}$).

Other transfer functions may be synthesised with various techniques, for example using the square-law or exponential characteristics of MOS in saturation or sub-threshold. Especially if using exponential characteristics the modulation may not be precisely zero even for values of $V_{in}$ more positive than a nominal threshold $V_{in1}$ where back bias modulation is not required, but will be negligible for all practical purposes so may be regarded as zero.

Referring back to FIG. 4 it will be appreciated that modulation currents $I_{BBA}$ and $I_{BBB}$ when applied will add to the overall current passing through resistors 202a and 202b. Although the additional current added is the same on both sides, and so the differential voltage is unaffected, this can modulate the common mode voltage for $V_{m1}$. In some applications this may not be a problem, for instance if circuitry downstream of the tap points for the differential signal $V_{m1}$ has a common mode range that is not exceeded by the effect of the modulation currents and if the common-mode rejection is good so that common-mode modulation does not translate to a spurious differential signal component. However at least in some case it may be desired to avoid such common mode modulation when modulating the back bias.

Figure 7:
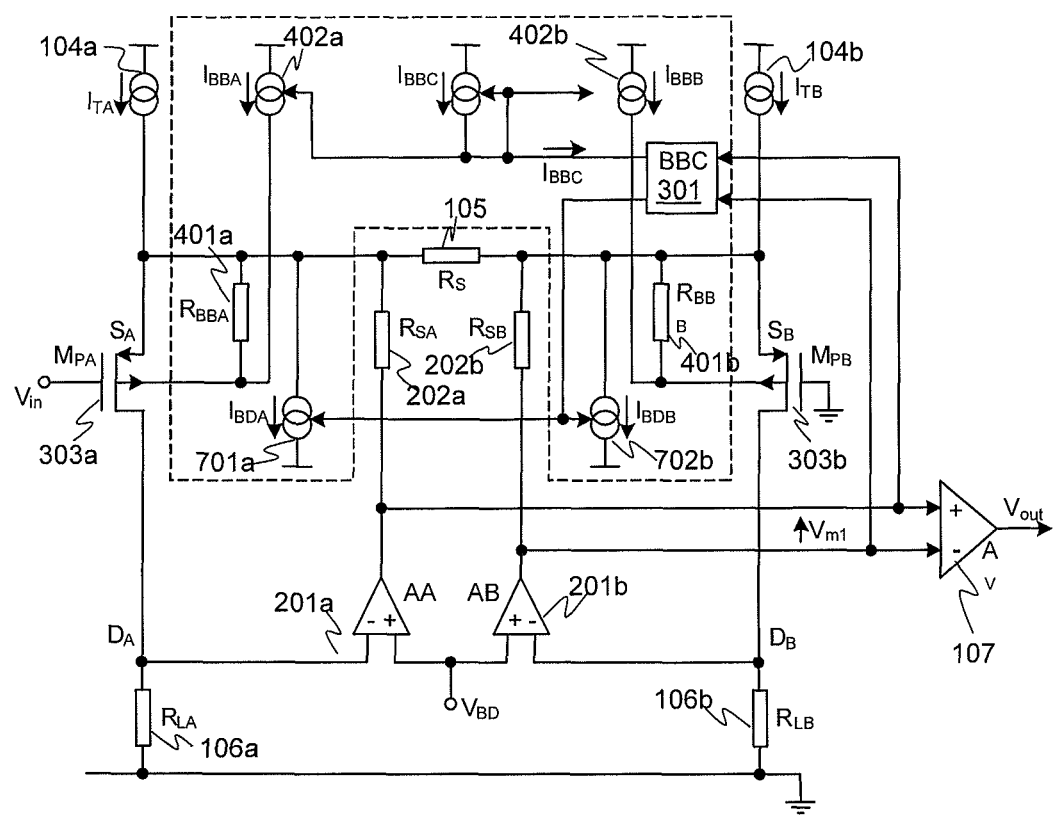
FIG. 7 illustrates an amplifier circuit according to further embodiment of the invention with compensation circuitry to avoid modulation of the common-mode voltage.

FIG. 7 shows another embodiment of the invention similar to that shown in FIG. 4 where similar components are identified by the same reference numerals. In the embodiment shown in FIG. 7 current sinks 601a and 602b are provided to sink currents $I_{BDA}$ and $I_{BDB}$ which are generated so as to be equal to the added current injected by modulation currents $I_{BBA}$ and $I_{BBB}$. Thus the additional current component added by modulation current $I_{BBA}$ for example will flow through resistor 401a, and modulate the voltage at the bulk terminal of transistor 303a but then this current will be sunk into current sink 601a so that the common mode of the differential signal $V_{m1}$ is substantially unaffected by the modulation currents.

Referring back to FIG. 5, to generate the sink currents $I_{BDA}$ and $I_{BDB}$, there may optionally therefore be additional current mirrors stages 505 and 506 to provide a control current for replicating by current mirrors 701a and 701b arranged as current sinks.

Figure 8:
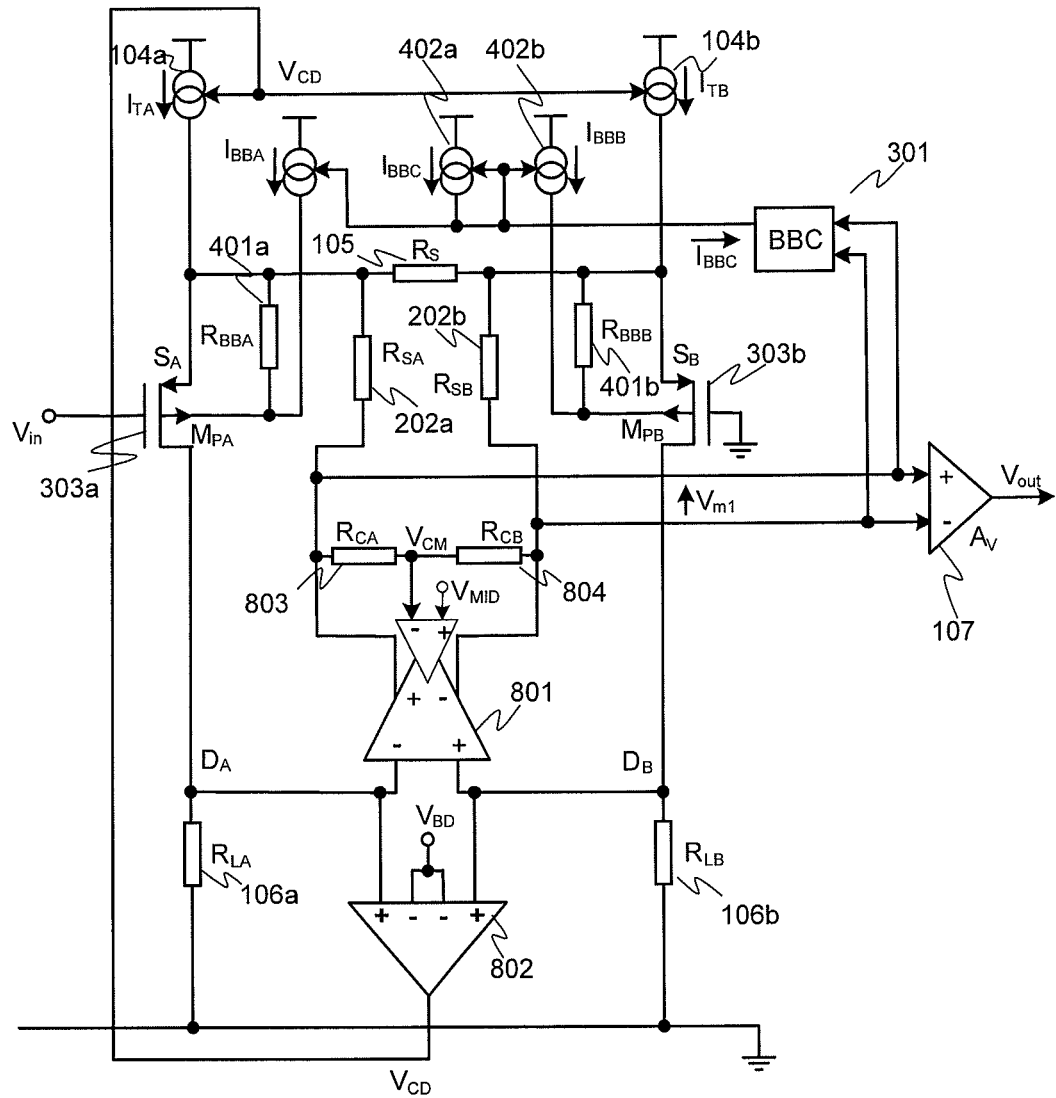
FIG. 8 illustrates a further embodiment having common-mode voltage control.

FIG. 8 illustrates another embodiment which provides modulation of the bulk-source voltages of the first and second transistors and which allows for control of the common-mode of the differential signal $V_{m1}$. In the circuit of FIG. 8 modulation currents $I_{BBA}$ and $I_{BBB}$ may be generated and supplied to the bulk terminals of the first and second transistors 303a and 303b as described previously. In this embodiment however amplifiers 801 and 802 are used instead of the differential amplifiers 201a and 201b of FIG. 4.

Amplifier 801 is a differential-input, differential-output amplifier of a type such as is known in the art. Its output is independent of the common mode voltage at its input. In this arrangement the output common-mode voltage is stabilised to be equal to a supplied voltage $V_{MID}$ independent of its differential output. The amplifier 801 is thus provided with the voltage $V_{MID}$ and a common mode voltage, for instance as developed by a resistive potential divider formed of resistors 803 and 804. The output common-mode voltage of $V_{m1}$ is thus well-controlled and does not vary with the input signal $V_{in}$ or process tolerances for example.

The virtual earth action of amplifier 801 will keep the voltage difference between nodes $D_A$ and $D_B$ small, but the amplifier 801 will not stabilise the common-mode voltage of $D_A$ and $D_B$. In fact by forcing the common-mode voltage of its outputs it may inject currents into resistors 202a and 202b which may then attempt to alter the voltages at $D_A$ and $D_B$.

As mentioned above, the modulation currents $I_{BBA}$ and $I_{BBB}$ will also apply a common-mode current into the nodes $S_A$ and $S_B$ and disturb common-mode conditions in the circuit.

To compensate for these common-mode currents, amplifier 802 modulates the (previously constant) currents $I_{TA}$ and $I_{TB}$. Amplifier 802 could be a simple op amp comparing the common-mode of $D_A$ and $D_B$ as derived by a resistive divider, but to avoid such resistive loading it may be implemented as a differential difference amplifier as shown, where each of $D_A$ and $D_B$ are compared with the desired bias voltage $V_{BD}$ and the results of the comparison summed (e.g. by summing output currents of respective transconductance stages) and used to control currents $I_{TA}$ and $I_{TB}$ via an output control voltage $V_{CD}$.

Figure 9A:
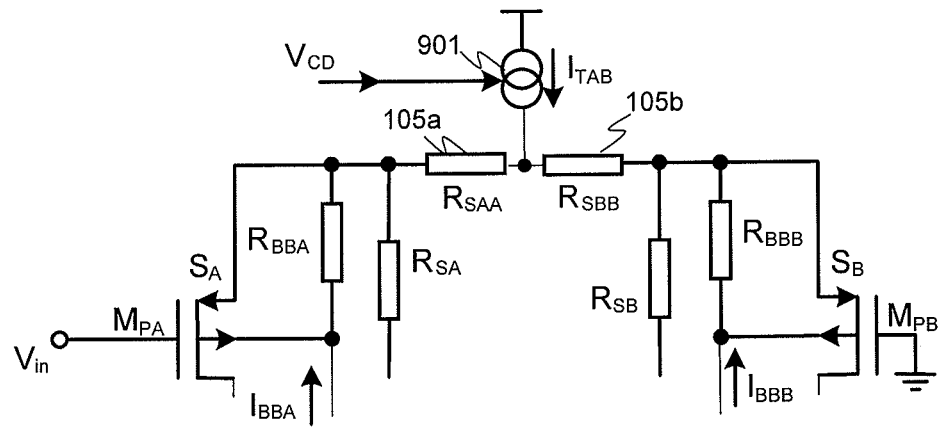
FIGS. 9a and 9b illustrate two further embodiments of common-mode control.
Figure 9B:
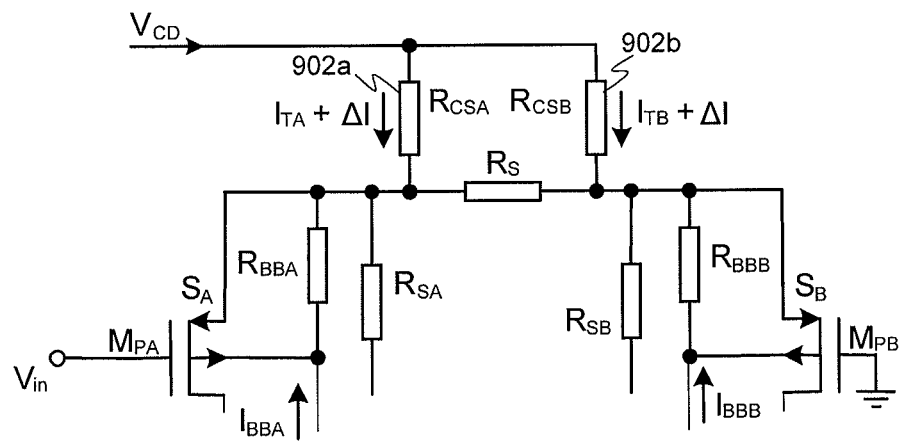

FIGS. 9a and 9b illustrate further ways in which the common mode could be controlled. In the embodiment shown in FIG. 9a a single current source 901 is used to generate the transistor source currents but tapped into the midpoint of resistor 105 which is separated into two halves, 105a and 105b. This reduces offsets of the current sources or modulations thereof, but does mean that the circuit is more offset-sensitive to any mismatch between the resistor 105a and 105b halves.

FIG. 9b illustrates that instead of current sources a pair of resistors 902a and 902b could be fed from the control voltage $V_{CD}$ of amplifier 802. Alternatively a single resistor at the mid-point of two resistors halves 105a and 105b could be used.

In various embodiments described above the modulation circuitry outputs are connected separately to respective bulk terminals of the pair of input transistors and applies equal modulation to these bulk terminals, resulting in equal signal-dependent modulation of the respective back-bias voltages despite any signal dependence of their source voltages. In further embodiments the modulation circuitry may still apply equal modulation to the bulk terminals, but further modulation may be applied to these bulk terminals for other purposes. For instance in the circuit of FIG. 4 the d.c. offset of the amplifier may be nulled by adding in further currents into the lower ends of resistors 401a, 401b in parallel to current sources 402a, 402b, these currents being deliberately imbalanced to give additional and different back-bias voltage components in order to give a difference in the threshold voltages of transistors 303a and 303b equal and opposite to the offset voltage of the amplifier. These current sources may be pre-defined or adjusted during manufacturing test, or may be part of some offset-cancelling d.c. servo loop. The d.c. offsets may be small, say less than 10 mV, so will not significantly alter the input range: if a large offset is anticipated the modulation control circuitry may need to be designed with extra margin to allow this additional modulation.

Figure 10:
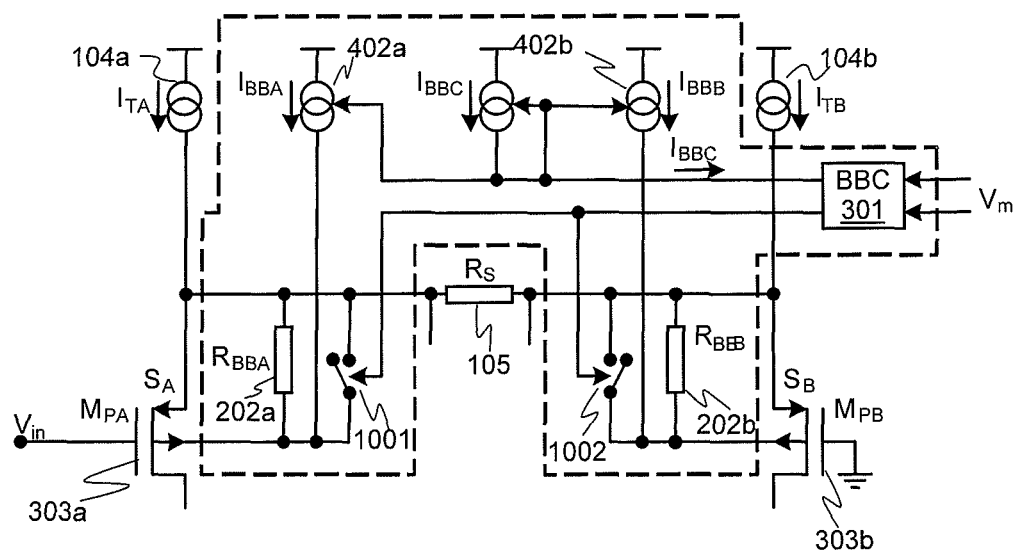
FIG. 10 illustrates a further embodiment.

FIG. 10 illustrates modulation circuitry according to a further embodiment. As mentioned above, the modulation circuitry according to above described embodiments of the invention may introduce some extra noise into the signal for example from the thermal noise of the resistors $R_{BBA}$ 202a, $R_{BBB}$ 202b and thermal noise of devices generating and mirroring the required currents. For normal amplitude signals there may be no need to operate with a non-zero back-bias. Thus modulation circuitry may include switch elements 1001 and 1002 added in parallel with resistors $R_{BBA}$ 202a and $R_{BBB}$ 202b respectively so as to short these resistors unless the monitored signal indicates that some non-zero back-bias is desirable. The switch elements 1001 and 1002 may be controlled by the control circuitry 301 and closed for instance when the first boundary is reached (or just before the first boundary if desired). The switch elements may, for example may be MOS transistors such as CMOS transmission gate structures comprising parallel connected PMOS and NMOS transistors that are controlled by complementary gate signals.

It will be noted that the embodiments described above have used PMOS input transistors and amplifier circuitry between ground and a positive supply, with the aim of increasing the usable input range to allow a greater swing below ground. Other embodiments may use the same PMOS-input circuitry coupled between a negative supply and ground, perhaps for applications where the quiescent transducer voltage is negative, with the aim of increasing the usable input range to allow a greater swing below the negative supply.

Figure 11:
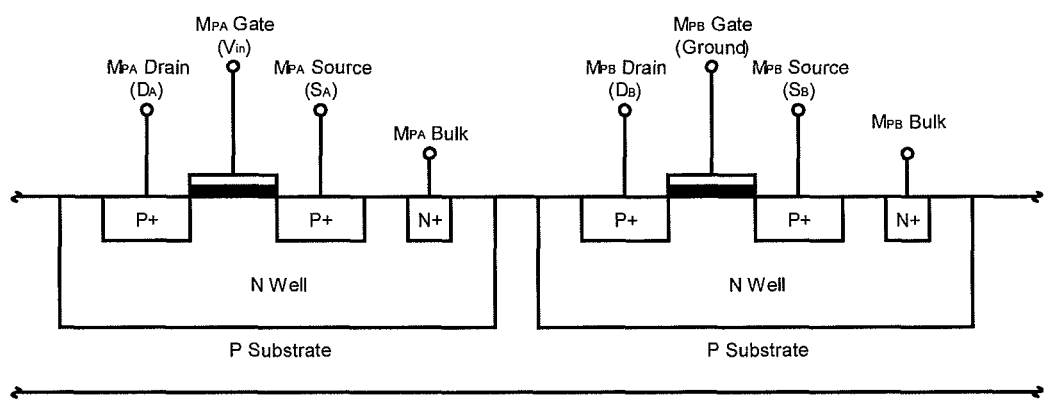
FIG. 11 illustrates one example of two P channel MOS transistors.

The first and second transistors may be implemented in the same silicon substrate. FIG. 11 illustrates one example of the cross section of the pair of transistors 303a, 303b. Each transistor comprises a four terminal arrangement with separate gate, source, drain terminals and bulk terminals and with each of the transistors in electrically separate n-wells so as to allow different well voltages to be applied to the different transistors.

Other embodiments may use similar circuitry but with NMOS replacing PMOS and vice-versa and inverted power supplies, for instance NMOS input circuitry coupled between ground and a positive supply to allow a greater input swing above the positive supply or NMOS-input circuitry coupled between a negative supply and ground to allow a greater input swing above ground. Rather than one supply being ground, i.e. a unipolar supply, the circuitry may run from bipolar supplies.

Using NMOS circuitry with separate bulk connections in a process with a p-substrate may require the use of isolated wells via "triple-well" techniques including the use of an n-type layer underneath and around pockets of p-type material.

In general then embodiments of the invention provide amplifier circuitry for receiving and amplifying an input signal derived from a transducer where the bulk voltage of at least a first MOS transistor of the amplifier signal path is modulated with respect to the source voltage, i.e. a back-bias is applied, so as to improve the range of input signals that can be received before unwanted device behaviour, e.g. signal clipping. The modulation of the bulk voltage relative to the source voltage is signal dependent and only applied for a first range of input signal values, possibly up to a maximum value. Within the first range, before the maximum value is reached the modulation applied may be signal dependent and may have a substantially continuous variation with signal values in the first range. In particular the first transistor may form at least part of a differential amplifier with a second transistor and the same bulk-source modulation may be separately but equally applied to both the first and second transistors despite any signal-dependent difference in their source voltages so as to not affect the output signal value. In some embodiments the circuitry may also have common-mode control circuitry to compensate for any change in common-mode voltage resulting from the applied bulk-source modulation and/or to generally control the common-mode voltage of the signal.

Embodiments thus generally provide amplifier circuits for amplifying an input signal from a MEMS capacitive transducer which have first and second MOS transistors with respective source terminals electrically connected via a resistance and with respective gate terminals connected to the input signal from the transducer and a reference voltage respectively. Modulation circuitry is configured to equally modulate the back-bias of each said transistor in response to a monitored signal dependent on the value of said input signal relative to said reference voltage. In other words the modulation circuitry may equally vary the back-bias between a bulk terminal and a source terminal of each said transistor in accordance with the value of the input signal, e.g. in response to a monitored signal dependent on the value of the input signal.

Embodiments of the present invention may be used with MEMS or similar capacitive transducers, especially MEMS microphones. Embodiments of the invention may be arranged as part of an audio and/or signal processing circuit, for instance an audio circuit which may be provided in a host device. A circuit according to an embodiment of the present invention may be implemented as an integrated circuit and may be implemented in a host device, especially a portable and/or battery powered host device such as a mobile telephone, an audio player, a video player, a PDA, a mobile computing platform such as a laptop computer or tablet and/or a games device for example.

The skilled person will recognise that various embodiments of the above-described apparatus and methods may be, at least partly, implemented using programmable components rather than dedicated hardwired components. Thus embodiments of the apparatus and methods may be, at least partly embodied as processor control code, for example on a non transitory carrier medium such as a disk, CD- or DVD-ROM, programmed memory such as read only memory (Firmware), or on a data carrier such as an optical or electrical signal carrier. In some applications, embodiments of the invention may be implemented, at least partly, by a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re-)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

What is claimed is:

1. An amplifier circuit for amplifying an input signal from a MEMS capacitive transducer, the circuit comprising:
   first and second MOS transistors each having source, gate, drain and bulk terminals, wherein the gate terminal of the first transistor is configured to receive the input signal and the source terminal of the first transistor is electrically coupled to the source terminal of the second transistor via an impedance and the gate terminal of the second transistor is configured to receive a reference voltage; and
   modulation circuitry configured to:
     receive a monitored signal which has a value that varies with the value of the input signal relative to said reference voltage; and
     controllably modulate a back-bias voltage between the bulk terminal and the source terminal of the first transistor and also a back-bias voltage between the bulk terminal and the source terminal of the second transistor,
     wherein the modulation applied to vary the back-bias voltage of each transistor is equal and based on said monitored signal.

2. An amplifier circuit as claimed in claim 1 wherein said modulation circuitry is configured to modulate the back-bias voltages of the first and second transistors so that the back-bias voltages are greater for a first range of values of the monitored signal relative to a second range of values of the monitored signal.

3. An amplifier circuit as claimed in claim 2 wherein for said second range of values said modulation circuitry is configured to apply a zero value modulation to said back-bias voltages.

4. An amplifier circuit as claimed in claim 1 wherein the modulation circuitry is configured to:
   maintain the voltage of the bulk terminal of each of said transistors so as to maintain the back-bias voltages of the transistors at base values if the monitored signal does not exceed a first boundary; and
   modulate the voltage of the bulk terminal of said each of said transistors so as to increase the back-bias voltages if the monitored signal exceeds the first boundary.

5. An amplifier circuit as claimed in claim 4 wherein said first boundary is set so as to correspond to the edge of a saturation operating mode of the first transistor in use with the first transistor having a back-bias voltage at the base value.

6. An amplifier circuit as claimed in claim 4 wherein said first boundary is set such that, when the monitored signal is at the first boundary, the value of the input signal is within a range of 50-150 mV of the edge of a saturation operating mode with the first transistor having a back-bias voltage at the base value.

7. An amplifier circuit as claimed in claim 4 wherein said first boundary is set such that, when the monitored signal is at the first boundary the value of the input signal is within a range of about −400 mv to −250 mV.

8. An amplifier as claimed in claim 4 wherein the base value of back-bias for the first transistor is substantially zero.

9. An amplifier circuit as claimed in claim 4 wherein the modulation circuitry is configured such that, when the monitored signal exceeds the first boundary, the magnitude of the back-bias voltage modulation applied increases with magnitude of the monitored signal.

10. An amplifier circuit as claimed in claim 9 wherein the magnitude of the back-bias voltage modulation applied increases with magnitude of the monitored signal until a maximum voltage modulation is reached.

11. An amplifier circuit as claimed in claim 1 wherein for at least some values of the monitored signal the back-bias voltage modulation is increased so as to allow an input signal peak value of at least −800 mV to be amplified without substantial clipping.

12. An amplifier circuit as claimed in claim 1 wherein the modulation circuitry comprises control circuitry for determining the amount of any voltage modulation to be applied and adjustment circuitry, responsive to the control circuitry, to apply any modulation.

13. An amplifier circuit as claimed in claim 12 wherein, for each said first and second transistors the bulk terminal and source terminal of the transistor are connected via a resistance and wherein the adjustment circuitry comprises first and second current sources for generating respective modulation currents at the bulk terminals of the first and second transistors in response to the control circuitry.

14. An amplifier circuit as claimed in claim 13 wherein said first and second current sources are current mirrors configured to replicate a control current generated by said control circuitry.

15. An amplifier circuit as claimed in claim 13 further comprising first and second current sinks respectively connected to the source terminals of the first and second transistors for sinking a current substantially equal to the respective modulation current.

16. An amplifier circuit as claimed in claim 12 wherein the control circuitry comprises a control differential amplifier for receiving the monitored signal and generating a control current based on the monitored signal.

17. An amplifier circuit as claimed in claim 16 wherein said control differential amplifier has an input voltage offset such that the control current is zero unless the monitored signal exceeds the input voltage offset.

18. An amplifier circuit as claimed in claim 17 wherein said control differential amplifier comprises first and second control circuit transistors and said first and second control circuit transistors have different channel characteristics to provide at least part of said input voltage offset.

19. An amplifier circuit as claimed in claim 17 wherein said control differential amplifier comprises first and second control circuit transistors and said first and second control circuit transistors are configured to have different source voltages and/or currents in use so as to provide at least part of said input voltage offset.

20. An amplifier circuit as claimed in claim 16 wherein said control differential amplifier generates an intermediate current and the control circuit further comprises at least one current source or current sink for generating a threshold current configured such that the control current corresponds to any component of the intermediate current greater than the threshold current.

21. An amplifier circuit as claimed in claim 1 wherein the first and second transistors are configured as part of a differential amplifier to generate a differential signal corresponding to the input signal.

22. An amplifier circuit as claimed in claim 21 wherein said differential signal is used as said monitored signal.

23. An amplifier circuit as claimed in claim 21 further comprising common-mode control circuitry for controlling the common-mode voltage of said differential signal.

24. An amplifier circuit as claimed in claim 23 wherein said common-mode control circuitry comprises comparison circuitry for comparing a drain voltage of each of the first transistor and second transistor with a reference bias voltage and adjusting source currents supplied to the source terminals of each of the first transistor and second transistor.

25. An amplifier circuit as claimed in claim 1 wherein said first and second transistors are P-channel MOS transistors and increasing the back-bias voltage of said transistors comprises modulating the voltage of the bulk terminal to be more positive than the voltage of the source terminal.

26. An amplifier circuit as claimed in claim 1 further comprising a MEMS capacitive microphone.

27. An electronic device comprising an amplifier circuit as claimed in claim 1.

28. An electronic device as claimed in claim 27 wherein said electronic device is at least one of: a portable device, a battery powered device, a computing device, a communications device; a gaming device; a mobile telephone; a laptop computer; and a tablet computer.

29. A method of amplifying an input signal produced by a MEMS capacitive transducer, the method comprising:
  applying the input signal to a gate terminal of a first MOS transistor;
  applying a reference voltage to a gate terminal of a second MOS transistor;
    wherein the a source terminal of the first transistor is electrically coupled to a source terminal of the second transistor via an impedance;
  receiving a monitored signal which has a value that varies with the value of the input signal relative to said reference voltage; and
  controllably modulating a back-bias voltage between a bulk terminal and the source terminal of the first transistor and also a back-bias voltage between a bulk terminal and the source terminal of the second transistor,
    wherein the modulation applied to vary the back-bias voltage of each transistor is equal and based on said monitored signal.

30. An amplifier circuit for amplifying an input signal from a MEMS capacitive transducer, the circuit comprising:
  first and second MOS transistors configured such that the gate terminal of the first transistors is driven by the input signal and source terminals of the first and second transistors are electrically coupled via an impedance wherein the back-bias between a bulk terminal and a source terminal of the each said transistor varies equally in accordance with the value of the input signal.

31. An amplifier circuit for amplifying an input signal from a MEMS capacitive transducer, the circuit comprising:
- first and second MOS transistors with respective source terminals electrically connected via a resistance and with respective gate terminals connected respectively to the input signal and a reference voltage; and
- modulation circuitry configured to equally modulate the back-bias of each said transistor in response to a monitored signal dependent on the value of said input signal relative to said reference voltage.

* * * * *